United States Patent
Fischer et al.

(10) Patent No.: US 6,445,639 B2
(45) Date of Patent: Sep. 3, 2002

(54) INTEGRATED DYNAMIC SEMICONDUCTOR MEMORY WITH TIME CONTROLLED READ ACCESS

(75) Inventors: Helmut Fischer, Taufkirchen; Thoralf Graetz, Dresden, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/735,338

(22) Filed: Dec. 12, 2000

(30) Foreign Application Priority Data

Dec. 12, 1999 (DE) .......................... 199 60 557

(51) Int. Cl.$^7$ ................................ G11C 8/00
(52) U.S. Cl. .................. 365/230.06; 365/200
(58) Field of Search ................. 365/200, 210, 365/230.06, 51, 63

(56) References Cited

U.S. PATENT DOCUMENTS

| | | | |
|---|---|---|---|
| 4,558,435 A | 12/1985 | Hsieh | 365/203 |
| 4,979,145 A | 12/1990 | Remington et al. | 364/900 |
| 5,257,229 A * | 10/1993 | McClure et al. | 326/106 |
| 5,424,986 A * | 6/1995 | McClure | 365/200 |
| 5,594,701 A * | 1/1997 | Asaka et al. | 365/200 |
| 5,822,257 A * | 10/1998 | Ogawa | 365/189.02 |
| 5,886,918 A * | 3/1999 | Nakamura | 365/200 |
| 5,970,003 A * | 10/1999 | Miyatake et al. | 365/200 |
| 6,134,160 A * | 10/2000 | Waller et al. | 365/185.09 |

* cited by examiner

Primary Examiner—Hoai Ho
Assistant Examiner—Thong Le
(74) Attorney, Agent, or Firm—Laurence A. Greenberg; Werner H. Stemer; Gregory L. Mayback

(57) ABSTRACT

An integrated dynamic semiconductor memory has memory cells which are provided in a matrix-like memory cell array and are combined to form units with column lines and row lines. The integrated dynamic semiconductor memory has a decoder for selecting one of the column lines and a sense amplifier which is jointly allocated to all the memory cells in a selected column line. The sense amplifier is connected to a data signal line for the purpose of further processing a data signal from an addressed memory cell. The decoder for selecting one of the column lines and the sense amplifier are provided at the edge and on opposite sides of the memory cell array. By separating the control for selection of the column lines and of the data output path, successive steps in the process of read access can be controlled in a self-adjusting manner by the respective preceding signal.

5 Claims, 2 Drawing Sheets

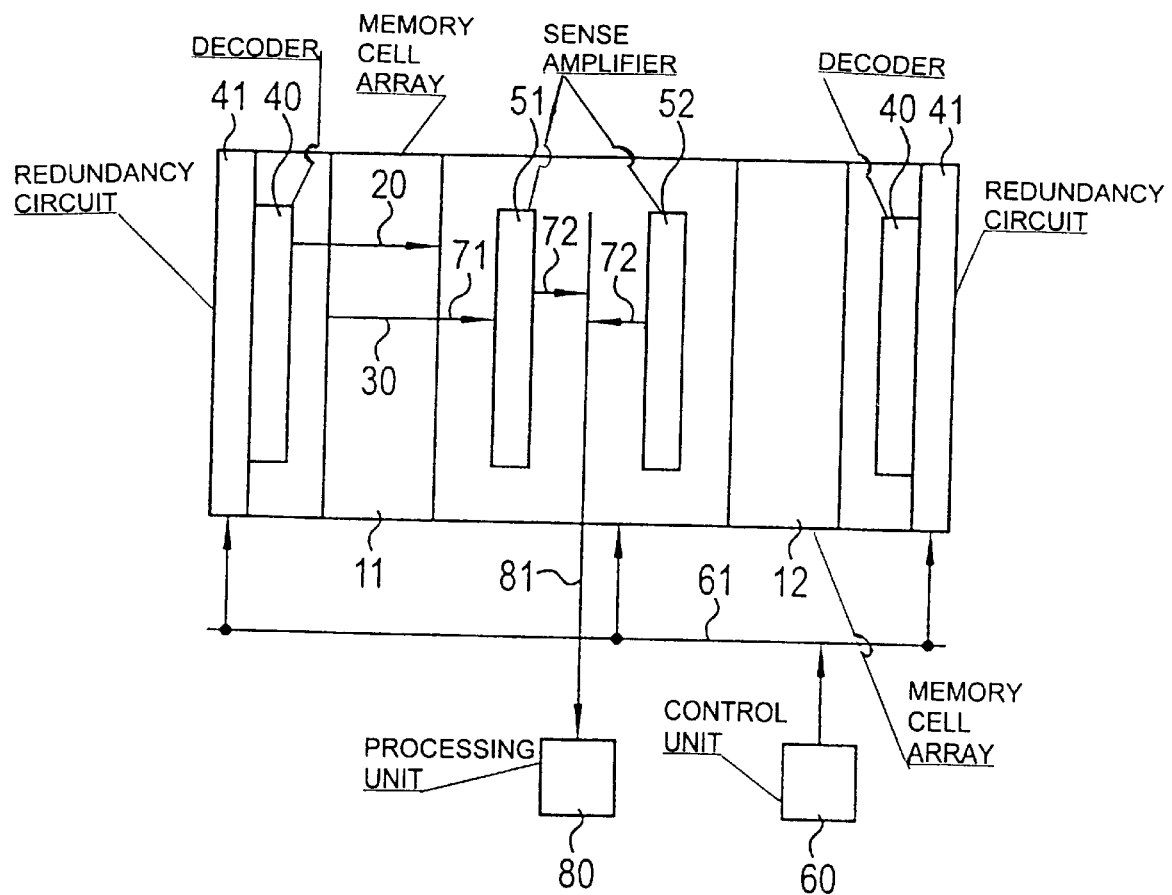

INTEGRATED DYNAMIC SEMICONDUCTOR MEMORY WITH TIME CONTROLLED READ ACCESS

BACKGROUND OF THE INVENTION

FIELD OF THE INVENTION

The invention relates to an integrated dynamic semiconductor memory having a matrix-like memory cell array containing memory cells which are combined to form units of column lines and row lines. A read access to one of the memory cells is time controlled from a selection of one of the column lines to an evaluation with a sense amplifier.

Integrated dynamic semiconductor memories have memory cells which are frequently provided in a matrix-like memory cell array. The memory cells are usually combined to form addressable units of column lines and row lines. These may, for example, be bit lines and word lines. The memory cells may be provided at points of intersection of the bit lines and word lines.

During read access to one of the memory cells, the relevant row line and column line are generally selected through the use of a decoder. After selection of the relevant row line, data signals from the memory cells along the row line are present on the corresponding column lines. These data signals are amplified in an adjacent so-called sense amplifier strip in the memory cell array. After selection of the relevant column line, the data signal from the addressed memory cell is released for further processing in a further sense amplifier (also called secondary sense amplifier). To prevent the further sense amplifier from switching too early, which may sometimes result in incorrect evaluation by the sense amplifier, it is necessary to wait for the time required until the already amplified data signal is present at the further sense amplifier.

The decoder for selecting one of the column lines and the further sense amplifier for further processing the data signal which is to be read are usually provided at the edge of the memory cell array. The maximum time to be waited between selection of the column line and evaluation by the further sense amplifier is accordingly measured from the delay time for the selection signal for selecting the column line to the most distant sense amplifier strip and from the return time for the amplified data signal on the relevant data signal line.

This control with respect to time may be achieved by using a delay circuit, for example, which models the maximum delay time for the selection signal and the maximum delay time for a data signal. Such a delay circuit has, by way of example, an inverter chain or, generally, delay stages constructed from logic gates. By modeling delay times in this way, there is a general reduction in the robustness of the integrated circuit, however. Such delay elements are comparatively sensitive to process, temperature and voltage fluctuations. This may result in variable and/or imprecisely adjustable delay times for the delay circuit. As a result, the operability of the relevant circuit configuration may be impaired during read access.

SUMMARY OF THE INVENTION

It is accordingly an object of the invention to provide a circuit configuration for an integrated dynamic semiconductor memory for performing a read access, from a selection of one of the column lines to an evaluation by a sense amplifier, which overcomes the above-mentioned disadvantages of the heretofore-known circuit configurations of this general type and in which the operability of the circuit is ensured over a broad range of process, temperature and voltage fluctuations.

With the foregoing and other objects in view there is provided, in accordance with the invention, an integrated dynamic semiconductor memory, including:

a memory cell array configured as a matrix and including memory cells; column lines and row lines;

the memory cells being combined to form addressable units with the column lines and the row lines;

a selection signal line running across the memory cell array for transmitting a selection signal for selecting one of the column lines;

a decoder connected to the selection signal line;

a sense amplifier having an input, the sense amplifier being jointly allocated to all of given ones of the memory cells provided in a selected one of the column lines;

a data signal line for transmitting a data signal of one of the memory cells present on the selected one of the column lines across the memory cell array, the data signal being an amplified data signal;

the input of the sense amplifier being connected to the data signal line for further processing the data signal; and the memory cell array having an edge and having opposite sides, the decoder and the sense amplifier being disposed at the edge and respectively on the opposite sides of the memory cell array.

In other words, the integrated dynamic semiconductor memory according to the invention has memory cells which are provided in a matrix-like memory cell array and are combined to form addressable units of column lines and row lines. It also has a decoder for selecting one of the column lines, the decoder being connected to a selection signal line for the purpose of transmitting a selection signal, and a sense amplifier which is jointly allocated to all of the memory cells in a selected column line. A data signal line is used to transmit an already amplified data signal from a memory cell in the selected column line, the data signal line being connected to the input of the sense amplifier for the purpose of processing the data signal further. The decoder for selecting one of the column lines and the sense amplifier are provided at the edge and on opposite sides of the memory cell array. This means that by isolating or separating the control for selection of the column lines and of the data output path, a kind of domino effect can be utilized during the control. This means that successive process steps in the process of a read access are controlled by the respective preceding signal. The process of the read access is thus provided with a self-adjusting manner of operation.

The active selection signal, which runs on the selection signal line via the memory cell array, selects the relevant column line, which releases the addressed memory cell's data signal for the purpose of transmission on the data signal line. The transmitted data signal, like the selection signal, runs toward the sense amplifier and reaches it at virtually the same time as the selection signal. During such a read access, the influence of technology on the signal delay time can thus be taken into account on a self-controlling basis. This eliminates modeling of the signal delay times through the use of delay elements, which prevents susceptibility to process, temperature or voltage fluctuations.

As soon as the data signal has reached the sense amplifier, it can be amplified by the sense amplifier and output for further processing. Since the data signal and the selection signal for selecting the column lines reach the sense amplifier at virtually the same time, the sense amplifier can be controlled by the selection signal for selecting the column lines in order to process the data signal further.

According to another feature of the invention, the semiconductor memory has memory cells, combined to form units of redundant column lines, and redundancy circuits for selecting one of the redundant column lines. In order to achieve the shortest possible signal paths, the redundancy circuits are usually provided next to the decoder for selecting one of the column lines. In the present case, the redundancy circuits are thus provided together with the decoder on the same side of the memory cell array.

If the semiconductor memory has a first and a second memory cell array which have the same structural configuration and are provided next to one another, then a sense amplifier provided between the first and second memory cell arrays can be allocated to the first and second memory cell arrays for the purpose of processing data signals further. Redundancy circuits usually have programmable fuses, e.g. in the form of laser fuses, which need to be accessible from the surface of the semiconductor memory. If there is a redundancy circuit between the first and second memory cell arrays, the sense amplifier cannot be allocated to the first and second memory cell arrays jointly, because the lines cannot be routed over the redundancy circuit. On the other hand, suitable routing of lines is possible as a result of providing the redundancy circuits together with the decoder on the side of the memory cell array opposite from the sense amplifier, according to a preferred feature of the invention. A sense amplifier allocated to the first and second memory cell arrays for the purpose of processing data signals further permits a saving in terms of surface area.

In a further embodiment of the invention, the semiconductor memory has a first and a second sense amplifier which are provided between the first and second memory cell arrays and are each allocated to one of the memory cell arrays for the purpose of processing data signals further. Each of the sense amplifiers has an output for outputting the respective data signal which is to be processed further. In the interests of a low space requirement, the outputs of the first and second sense amplifiers are connected to a common output signal line.

Other features which are considered as characteristic for the invention are set forth in the appended claims.

Although the invention is illustrated and described herein as embodied in an integrated dynamic semiconductor memory with a time controlled read access, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a block diagram of an integrated dynamic semiconductor memory configuration having the column decoder and the sense amplifier disposed in accordance with the invention.

DESCRIPTION OF THE PREFERRED EMBODIMENTS

Figure 1:
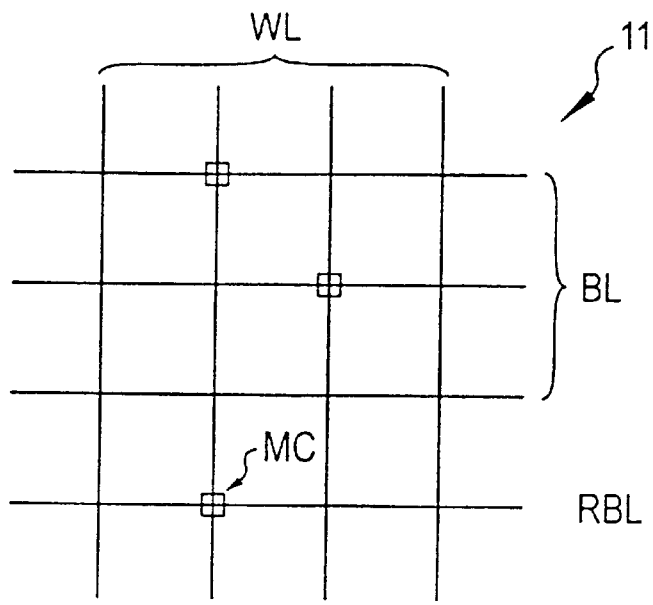
FIG. 1 is a schematic view of a memory cell array.

Referring now to the figures of the drawings in detail and first, particularly, to FIG. 1 thereof, there is shown a DRAM memory cell array 11 which is organized in the form of a matrix and has regular word lines WL, bit lines BL and redundant bit lines RBL with memory cells MC provided at the points of intersection thereof. The memory cells MC in the memory shown each contain a selection transistor and a storage capacitor. In this case, control inputs of the selection transistors are connected to one of the word lines WL, while a main current path in the selection transistors is provided between the storage capacitor in the respective memory cell MC and one of the bit lines BL or redundant bit lines RBL.

Figure 2:
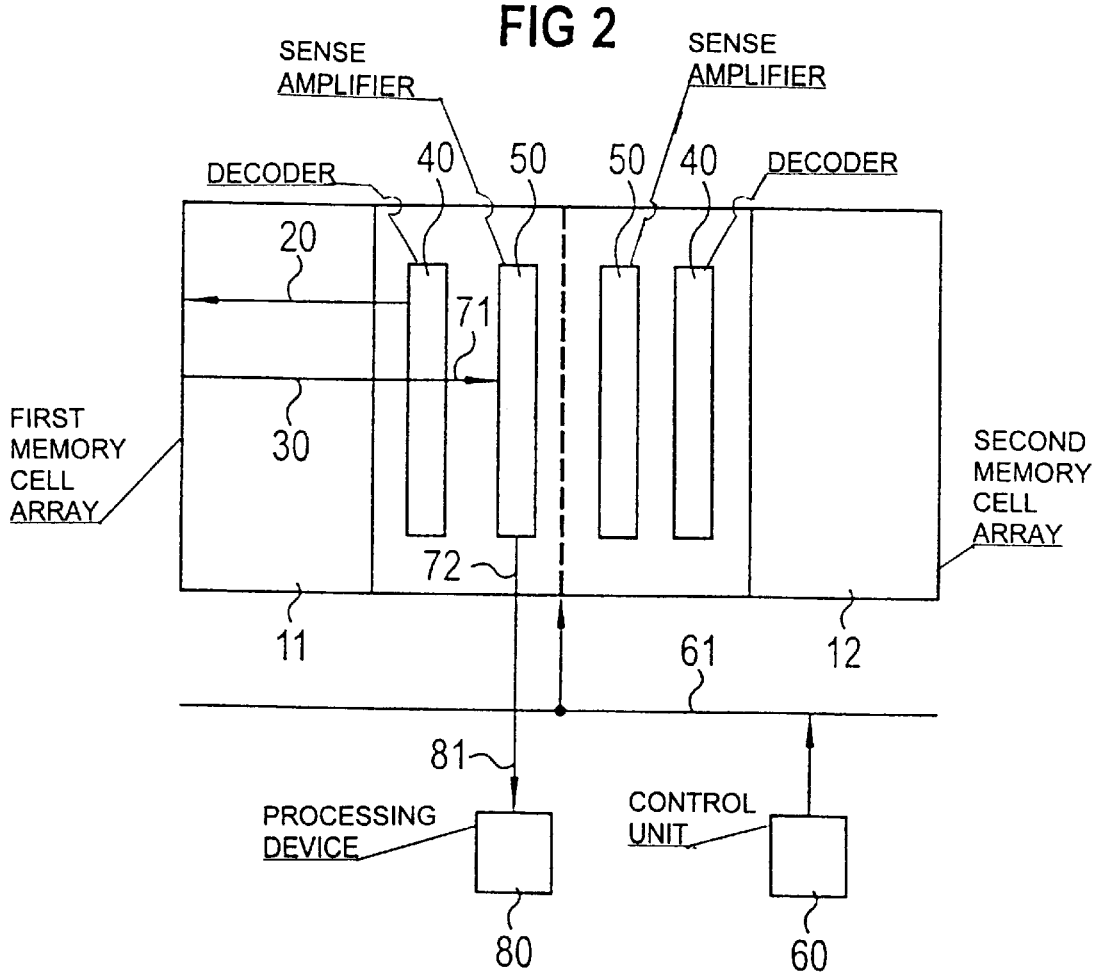
FIG. 2 is a block diagram of an integrated dynamic semiconductor memory having a column decoder and a sense amplifier provided next to one another.

FIG. 2 shows a circuit configuration for the semiconductor memory having a first memory cell array 11 and a second memory cell array 12, which have the same structural configuration and are provided next to one another. For each of the memory cell arrays, the circuit configuration has a decoder 40 for selecting one of the bit lines BL and a respective sense amplifier 50 which is jointly allocated to all the memory cells MC in a selected bit line BL in one of the memory cell arrays 11 or 12. The decoders 40 are connected to a selection signal line 20 for the purpose of transmitting a selection signal. A data signal line 30 is used to transmit a data signal from a memory cell MC in the selected bit line, the data signal having already been amplified in a sense amplifier strip. The input 71 of the sense amplifier 50 is connected to the data signal line 30 for the purpose of processing the data signal further.

The control unit 60 transmits control and address signals via the control and address bus 61. The decoder 40 uses the selection signal line 20 to select one of the bit lines BL, whereupon an already amplified data signal from an addressed memory cell is transmitted to the sense amplifier 50 via the data signal line 30. An output 72 is connected to an output signal line 81 for the purpose of processing the data signal further in the processing device 80. With regard to modeling the maximum signal delay times using a delay circuit, the delay time for the selection signal on the selection signal line 20 to the most distant sense amplifier strip in the memory cell array 11 and the return time for the data signal on the data signal line 30 need to be taken into account in this case.

FIG. 3 shows a circuit configuration for a semiconductor memory, which is similar to the circuit configuration shown in FIG. 2. In contrast to the latter, however, the decoders 40 for selecting one of the bit lines BL and the respective sense amplifiers 51 and 52 are provided at the edge and on opposite sides of the memory cell arrays 11 and 12. Since the selection signal on the selection signal line 20 and the associated data signal on the data signal line 30 each run in the same direction to the sense amplifier 51, the two signals reach the sense amplifier at virtually the same time. The sense amplifier 51 can thus be controlled by the incoming selection signal on the selection signal line 20. This provides a self-adjusting manner of operation during read access, the influence of technology on the delay time over the memory cell array 11 being taken into account on a self-controlling basis.

The circuit configuration also has redundancy circuits 41 for selecting one of the redundant bit lines RBL. The redundancy circuits 41 are provided, together with the decoders 40 for selecting one of the bit lines BL, on the same side of the memory cell array 11 or 12. Since the redundancy circuits are not provided between the memory cell arrays 11 and 12, as is necessary in the circuit shown in FIG. 2, the outputs 72 of the sense amplifiers 51 and 52 can be connected to a common output signal line 81. It is likewise conceivable for the two sense amplifiers 51 and 52 to be combined to form a common sense amplifier which is provided between the memory cell array 11 and memory cell array 12 and is allocated to the memory cell array 11 and, respectively, 12 for the purpose of further processing data signals.

We claim:

1. An integrated dynamic semiconductor memory, comprising:

a memory cell array configured as a matrix and including memory cells;

column lines and row lines;

said memory cells being combined to form addressable units with said column lines and said row lines;

a decoder generating a selection signal;

a selection signal line connected to said decoder and running across said memory cell array for transmitting the selection signal for selecting one of said column lines;

a sense amplifier having an input, said sense amplifier being jointly allocated to all of given ones of said memory cells provided in a selected one of said column lines, said memory cells being disposed between said decoder and said sense amplifier;

a data signal line for transmitting a data signal of one of said memory cells present on said selected one of said column lines across said memory cell array, the data signal being an amplified data signal;

said input of said sense amplifier being connected to said data signal line for further processing the data signal; and said memory cell array having an edge and having opposite sides, said decoder and said sense amplifier being disposed at said edge and respectively on said opposite sides of said memory cell array.

2. The integrated dynamic semiconductor memory according to claim 1, wherein said sense amplifier is controllable by the selection signal for further processing the data signal.

3. The integrated dynamic semiconductor memory according to claim 1, including:

redundant column lines;

further memory cells combined to form further units with said redundant column lines;

redundancy circuits for selecting one of said redundant column lines; and said redundancy circuits and said decoder being disposed on a same one of said opposite sides of said memory cell array.

4. The integrated dynamic semiconductor memory according to claim 3, including:

a further memory cell array being structurally configured like said memory cell array, said memory cell array and said further memory cell array being disposed next to one another; and said sense amplifier being disposed between said memory cell array and said further memory cell array and being allocated to said memory cell array and to said further memory cell array for further processing data signals.

5. The integrated dynamic semiconductor memory according to claim 3, including:

a further memory cell array being structurally configured like said memory cell array, said memory cell array and said further memory cell array being disposed next to one another;

a further sense amplifier, said sense amplifier and said further sense amplifier being disposed between said memory cell array and said further memory cell array;

said sense amplifier being allocated to said memory cell array and said further sense amplifier being allocated to said further memory cell array for further processing data signals;

said sense amplifier and said further sense amplifier each having a respective output for outputting a respective data signal to be further processed; and a common output signal line connected to said respective output of each of said sense amplifier and said further sense amplifier.

* * * * *

UNITED STATES PATENT AND TRADEMARK OFFICE
CERTIFICATE OF CORRECTION

PATENT NO. : 6,445,639 B2
DATED : September 3, 2002
INVENTOR(S) : Helmut Fischer et al.

It is certified that error appears in the above-identified patent and that said Letters Patent is hereby corrected as shown below:

<u>Title page,</u>
Item [30], should read as follows:

-- Foreign Application Priority Data

Dec. 15, 1999 (DE) …………………… 199 60 557.2 --

Signed and Sealed this

Seventeenth Day of December, 2002

JAMES E. ROGAN
*Director of the United States Patent and Trademark Office*